(12) United States Patent
Rabinowitz

(10) Patent No.: US 7,967,457 B2
(45) Date of Patent: Jun. 28, 2011

(54) CONTROL GRID FOR SOLAR ENERGY CONCENTRATORS AND SIMILAR EQUIPMENT

(76) Inventor: Mario Rabinowitz, Redwood City, CA (US)

( * ) Notice: Subject to any disclaimer, the term of this patent is extended or adjusted under 35 U.S.C. 154(b) by 857 days.

(21) Appl. No.: 11/837,481

(22) Filed: Aug. 10, 2007

(65) Prior Publication Data

US 2009/0038827 A1 Feb. 12, 2009

(51) Int. Cl.
*G02B 5/08* (2006.01)
(52) U.S. Cl. .......................................... 359/851
(58) Field of Classification Search .................. 359/296, 359/290, 291, 851, 951; 345/85, 107, 105, 345/108; 126/600–605
See application file for complete search history.

(56) References Cited

U.S. PATENT DOCUMENTS

| | | | |
|---|---|---|---|
| 4,130,903 A * | 12/1978 | Van Den Berg et al. ........... 2/8.3 |
| 5,075,591 A | 12/1991 | Holmberg |
| 5,409,549 A * | 4/1995 | Mori ............... 136/244 |
| 5,717,515 A | 2/1998 | Sheridon |
| 5,720,610 A * | 2/1998 | Stephenson .................. 431/365 |
| 5,754,332 A | 5/1998 | Crowley |
| 6,517,763 B1 | 2/2003 | Zakhidov et al. |
| 6,780,075 B2 * | 8/2004 | Okamoto et al. ............. 445/50 |
| 6,843,573 B2 | 1/2005 | Rabinowitz et al. |
| 6,875,274 B2 | 4/2005 | Wong et al. |
| 6,957,894 B2 | 10/2005 | Rabinowitz et al. |
| 6,964,486 B2 | 11/2005 | Rabinowitz |
| 6,975,445 B1 | 12/2005 | Rabinowitz |
| 6,988,809 B2 | 1/2006 | Rabinowitz |
| 7,063,753 B1 | 6/2006 | Chen et al. |
| 7,112,253 B2 | 9/2006 | Rabinowitz |
| 7,115,881 B2 | 10/2006 | Rabinowitz |
| 7,130,102 B2 | 10/2006 | Rabinowitz |
| 7,133,183 B2 | 11/2006 | Rabinowitz |
| 7,187,490 B2 | 3/2007 | Rabinowitz |
| 7,190,107 B2 | 3/2007 | Sasaki et al. |
| 7,417,234 B2 * | 8/2008 | Hastings et al. .............. 250/397 |
| 7,638,807 B2 * | 12/2009 | Yukinobu ........................ 257/88 |
| 2007/0272297 A1 * | 11/2007 | Krivoshlykov et al. ........ 136/256 |
| 2008/0264482 A1 * | 10/2008 | Lee et al. ....................... 136/256 |
| 2009/0035469 A1 * | 2/2009 | Sue et al. ....................... 427/282 |
| 2009/0095412 A1 * | 4/2009 | Abrams et al. ................. 156/230 |
| 2010/0101624 A1 * | 4/2010 | Fioretti et al. ................. 136/244 |

FOREIGN PATENT DOCUMENTS

WO PCT/US02/20199 6/2002

* cited by examiner

Primary Examiner — William C Choi
Assistant Examiner — Tuyen Tra

(57) ABSTRACT

This invention provides a manner to achieve affordable solar energy, as well as other technologies. It does so by improving control grids (for addressing and alignment) in solar concentrators and optical equipment in general. Thus troublesome and expensive grid material like Indium Tin Oxide (ITO) can be replaced by more manageable, hardier, and more cost effective nanotubes; or a carbon grid simply laid down by ordinary photocopy (Xerographic) reduction techniques. The instant invention relates to improvements in the control (addressing and alignment) grid for Solar Energy Concentrators; and similar equipment such as Optical Switches; and Display devices such as Dynamic Reflection, Illumination, and Projection equipment; as well as display equipment in general. The control grid acts to address and align active optical elements such as mirrored balls, multipainted balls, electrophoretic, and magnetophoretic cells in solar concentrators; and in other equipment. Fabrication of the grids is also described.

20 Claims, 1 Drawing Sheet

CONTROL GRID FOR SOLAR ENERGY CONCENTRATORS AND SIMILAR EQUIPMENT

FIELD OF THE INVENTION

The instant invention relates to improvements in the control (addressing and alignment) grid for Solar Energy Concentrators; and similar equipment such as Optical Switches [e.g. cf. U.S. Pat. No. 6,976,445 by M. Rabinowitz]; and Display devices such as Dynamic Reflection, Illumination, and Projection equipment [e.g. cf. U.S. Pat. No. 7,130,102 by M. Rabinowitz]. The control grid acts to address and align active optical elements such as mirrored balls, multipainted balls, electrophoretic, and magnetophoretic cells in solar concentrators [e.g. cf. U.S. Pat. Nos. 7,133,183 and 6,843,573 by M. Rabinowitz].

BACKGROUND OF THE INVENTION

This invention provides a better means to achieve affordable solar energy. It does so by improving control grids (for addressing and alignment) in solar concentrators, optical switches, and display devices such as reflection, illumination, and projection equipment in general. Thus troublesome and expensive grid material like Indium Tin Oxide (ITO) can be replaced by more manageable, hardier, and in the long run relatively less expensive nanotubes, or a carbon grid simply laid down by ordinary photocopy reduction techniques.

A nanotube is a nanometer scale wire-like structure that is most often composed of carbon. Carbon nanotubes are a few nanometers in diameter (approximately 50,000 times smaller than the width of a human hair), while they can be up to several millimeters in length. To date, carbon nanotubes are a preferred embodiment of the instant invention.

INCORPORATION BY REFERENCE

In a solar energy application (as well as other functions), elements in the form of transparent reflecting micro-balls and other shapes are a critical feature of a unique solar concentrator which directs sunlight to a receiver as described in the following patents and published papers related to this case. The following U.S. patents, and Solar Journal publication are fully incorporated herein by reference.

1. U.S. Pat. No. 7,247,790 by Mario Rabinowitz, "Spinning Concentrator Enhanced Solar Energy Alternating Current Production" issued on Jul. 24, 2007.
2. U.S. Pat. No. 7,187,490 by Mario Rabinowitz, "Induced Dipole Alignment Of Solar Concentrator Balls" issued on Mar. 6, 2007
3. U.S. Pat. No. 7,133,183 by Mario Rabinowitz, "Micro-Optics Solar Energy Concentrator" issued on Nov. 7, 2006.
4. U.S. Pat. No. 7,130,102 by Mario Rabinowitz, "Dynamic Reflection, Illumination, and Projection" issued on Oct. 31, 2006.
5. U.S. Pat. No. 7,115,881 by Mario Rabinowitz and Mark Davidson, "Positioning and Motion Control by Electrons, Ions, and Neutrals in Electric Fields" issued on Oct. 3, 2006.
6. U.S. Pat. No. 7,112,253, by Mario Rabinowitz, "Manufacturing Transparent Mirrored Mini-Balls for Solar Energy Concentration and Analogous Applications" issued on Sep. 26, 2006.
7. U.S. Pat. No. 7,077,361, by Mario Rabinowitz, "Micro-Optics Concentrator for Solar Power Satellites" issued on Jul. 18, 2006.
8. U.S. Pat. No. 6,988,809 by Mario Rabinowitz, "Advanced Micro-Optics Solar Energy Collection System" issued on Jan. 24, 2006.
9. U.S. Pat. No. 6,987,604 by Mario Rabinowitz and David Overhauser, "Manufacture of and Apparatus for Nearly Frictionless Operation of a Rotatable Array of Micro-Mirrors in a Solar Concentrator Sheet" issued on Jan. 17, 2006.
10. U.S. Pat. No. 6,975,445 by Mario Rabinowitz, "Dynamic Optical Switching Ensemble" issued on Dec. 13, 2005.
11. U.S. Pat. No. 6,964,486 by Mario Rabinowitz, "Alignment of Solar Concentrator Micro-Mirrors" issued on Nov. 15, 2005.
12. U.S. Pat. No. 6,957,894 by Mario Rabinowitz and Felipe Garcia, "Group Alignment Of Solar Concentrator Micro-Mirrors" issued on Oct. 25, 2005.
13. U.S. Pat. No. 6,843,73 by Mario Rabinowitz and Mark Davidson, "Mini-Optics Solar Energy Concentrator" issued on Jan. 18, 2005.
14. U.S. Pat. No. 6,738,176 by Mario Rabinowitz and Mark Davidson, "Dynamic Multi-Wavelength Switching Ensemble" issued on May 18, 2004.
15. U.S. Pat. No. 6,698,693 by Mark Davidson and Mario Rabinowitz, "Solar Propulsion Assist" issued on Mar. 2, 2004.
16. U.S. Pat. No. 6,612,705 by Mark Davidson and Mario Rabinowitz, "Mini-Optics Solar Energy Concentrator" issued on Sep. 2, 2003.
17. Solar Energy Journal, Vol. 77, Issue #1, 3-13 (2004) "Electronic film with embedded micro-mirrors for solar energy concentrator systems" by Mario Rabinowitz and Mark Davidson.

DEFINITIONS

"Allotrope" means that there are two or more different physical forms of a given atomic element. Graphite, charcoal, diamond, buckeyballs, and nanotubes are all allotropes of carbon.

"Admix" means to mix one thing together with another.

"Bus bars are low resistivity electrodes that permit uniform distribution of voltage across a high resistivity optically transparent surface, in contrast to the grid wires which are high resistivity.

"Boron nitride (BN)" is a binary chemical compound, consisting of equal proportions of boron and nitrogen that can be made in nanotube form. Boron nitride possess three polymorphic forms; one analogous to diamond, one analogous to graphite and ones analogous to the fullerenes. The diamond-like allotrope of boron nitride is one of the hardest known materials but is softer than materials such as diamond, ultra-hard fullerite, and aggregated diamond nanorods.

"Collector" or "Receiver" as used herein denotes any device for the conversion of solar energy into other forms such as electricity, heat, pressure, concentrated light, etc.

"Concentrator" as used herein in generally refers to a micro-mirror system for focussing and reflecting light. In a solar energy context, it is that part of a solar Collector system that directs and concentrates solar radiation onto a solar receiver or other device. As used herein, concentrator refers to an ensemble of focussing planar mirrors which acts as a thin almost planar mirror constructed with stepped varying angles so as to have the optical properties of a much thicker concave mirror. Heuristically, it can somewhat be thought of as the projection of thin variable-angular segments of small portions of a thick mirror upon a planar surface. It is a focusing planar reflecting surface much like a planar Fresnel lens is a focusing transmitting surface.

"Diamond-like carbon" is the generic name for a very hard family of materials in which the molecular backbone is primarily carbon, with some hydrogen attached.

"Elastomer" is a material such as synthetic rubber or plastic, which at ordinary temperatures can be stretched substantially under low stress, and upon immediate release of the stress, will return with force to approximately its original length. Silicone elastomers have exceptional ability to withstand ultraviolet light degradation.

"Element" as used here is a rotatable mirrored component of a concentrator, such as a ball, cylinder, disk, semi-sphere, etc.

"Equipment" is used herein as a generic term for Solar Energy Concentrators and the mirrored elements (balls) within; and similar equipment such as Optical Switches; Dynamic Reflection, Illumination, and Projection equipment; and Display equipment in general. The Solar Energy Concentrators may be of the Fresnel reflector type, or other types and equipment requiring addressing and alignment.

"Focussing planar mirror" is a thin almost planar mirror constructed with stepped varying angles so as to have the optical properties of a much thicker concave (or convex) mirror. It can heuristically be thought of somewhat as the projection of thin equi-angular segments of small portions of a thick mirror upon a planar surface. It is a focusing planar reflecting surface much like a planar Fresnel lens is a focusing transmitting surface. If a shiny metal coating is placed on a Fresnel lens it can act as a Fresnel reflector.

"Grid" as used herein receives signals from a microprocessor or similar device to address and align, or otherwise control optically active elements in Solar and other optical equipment. Grid wires have high resistance so they can produce voltage drops (potential differences) with only a small flow of electrical current.

"Grid layer implementation" may be accomplished by conventional methods such as dipping, spraying, spin coating and flow coating, brushing, roll coating, chemically, by vacuum deposition, by plasma-enhanced chemical vapor deposition, and other art-recognized techniques.

"ITO" is a thin, transparent conducting alloy of Indium/Tin Oxide that is commonly used for grids.

"Lexan" is General Electric's trade name for a group of polyesters formed from carbonic acid, and generally called polycarbonates (PC). Polycarbonates have excellent mechanical properties while at the same time it has an ease for molding and extrusion. Lexan has good dimensional stability, good resistance to creep, and a high distortion temperature.

"Lucite" is DuPont's trade name for its transparent acrylic plastic and resins with no definite melting point.

"Mirror" as used herein refers to a highly reflective smooth surface (smooth on a size scale small compared to the wavelength of incident light). The smoothness achieves specular reflection.

"Molybdenum disulfide, also called molybdenum sulfide or molybdenum(IV) sulfide, with the formula $MoS_2$," is a black crystalline sulfide of molybdenum that can be made in nanotube form.

"Nanotube" is a nanometer scale wire-like structure that is most often composed of carbon, but may also be inorganic (non-carbon).

"Optical communication" as used herein means that an optical signal comes into the equipment, and/or an optical signal goes out of the equipment.

"Optically transparent" as used herein means transparent to light at least in the range of about 2000 to approximately 7500 Angstroms wavelength.

"Plastic" as used herein is a monomer or polymeric material (usually organic) which can be shaped by flow. The resin is the homogeneous starting material, whereas the "plastic" refers to the final product also containing fillers, plasticizers, stabilizers, etc.

"Plasticizer" is added to a material to make it softer, more flexible, or more moldable. It is also called a flexibilizer because it is an additive that gives an otherwise rigid plastic flexibility.

"Plastic paint" is a paint composed of a plastic in a solvent such that when the solvent is removed as by vaporization, a thin film of the plastic remains on the surface.

"Plexiglass" is a transparent plastic made from methyl methacrylate, similar to Lucite. Both can readily be made in sheet form.

"Sealant or coating" as used herein includes but is not limited to sealing in lubricants and volatiles inside equipment, as well as preserving the equipment surface from wear, abrasion, ultraviolet light, heat, and other degradation processes.

"Silicon" is the atomic element with atomic number 14 that can be made in nanotube form. Silicon is less reactive than its chemical analog carbon. As the eighth most common atomic element in the universe by mass, silicon occasionally occurs as the pure free atomic element in nature, but is more widely distributed in dusts, planetoids and planets as various forms of silicon dioxide or silicate. In the Earth's crust, silicon is the second most abundant atomic element (after oxygen), making up 25.7% of the crust by mass. Silicon is also a component of silicones, a class-name for various synthetic plastic substances made of silicon, oxygen, carbon, germanium, and hydrogen. Silicon and Silicone are commonly mistaken for each other.

"Silicone" as used herein refers to a heat-stable, rubber-like elastomer that is a water repellent, semiorganic polymer of organic radicals attached to silicon containing molecules, such as dimethyl silicone. Silicone elastomers are an excellent material within which to embed the mirrored balls or cylinders, because of their durability with respect to ultraviolet light and general resiliency among other reasons.

"Substrate" is the outside surface of the equipment which contains the grid. The substrate shape is not critical, and the substrate may be flat, curved, patterned, etc., along any portion thereof, including the portion on which a substrate binder layer is deposited. The substrate may be formed of a single material or a plurality of materials and have multiple layers, as in a laminated substrate.

"Substrate Binder layer" is a layer that goes directly on and bonds with the surface of the equipment. The Substrate Binder layer facilitates bonding of the outer surface layer to the grid. This layer is preferably capable of forming strong bonds with both the substrate and the grid material.

"Substrate material equipment" as used herein may be formed of any polymeric or plastic material. Illustrative materials include polyacrylate, polyester, polyethylene, polypropylene, polyamides, polyimides, polycarbonate, epoxy, phenolic, acrylonitrile-butadiene-styrene and acetal plastics. The mirrored balls (elements) are preferably formed of polycarbonate or polyacrylate resin such as poly-methyl methacrylate) because of their excellent physical, mechanical and chemical properties. The substrates may contain various additives such as fillers, antioxidants, plasticizers and the like, in accordance with known techniques.

"Surfactant" is a substance that reduces the surface tension of a liquid in which it is dissolved.

"Titanium dioxide (B) or $TiO_2(B)$" is the monoclinic form of $TiO_2$ that can be made in nanotube form. This compound or mineral can be found in weathering rims on tektites and perovskites and as lamellae in anatase from hydrothermal veins and has a density lower than that of the other three polymorphs. In the laboratory anatase can be converted in a hydrothermal route to $TiO_2(B)$ nanotubes and nanowires.

"Thermoplastic" refers to materials with a molecular structure that will soften when heated and harden when cooled. This includes materials such as vinyls, nylons, elastomers, fluorocarbons, polyethylenes, styrene, acrylics, cellulosics, etc.

"Thixotropic" refers to the property of a material to become less viscous when subjected to an applied mechanical stress. For example some gels become liquid when they are stressed.

"Tungsten(IV) sulfide" is a chemical compound with the formula $WS_2$ that can be made in nanotube form. It occurs naturally as the mineral called tungstenite. $WS_2$ adopts a layered structure related to $MoS_2$. It is also used as a lubricant in conjunction with other similar sulfides, e.g. $MoS_2$.

"Xerographic reduction" as used herein refers to a Xerox or photographic process in which the grid is first produced graphically on paper, then Xerographically de-magnified (reduced) repeatedly until the resolution limit is reached. The final reduced copy lays down a thin carbon grid on a thin plastic sheet.

SUMMARY OF THE INVENTION

It is an aspect of the instant invention to provide a largely optically transparent grid for solar concentrators, optical switches; and reflection, illumination, and projection devices in general. Such optical equipment will herein simply be referred to as "equipment."

It is another aspect of the present invention to increase the longevity and performance of said grid.

An aspect of this invention is to provide a grid for optical equipment which is less costly, or otherwise superior to an ITO grid.

Other aspects and advantages of the invention will be apparent in a description of specific embodiments thereof, given by way of example only, to enable one skilled in the art to readily practice the invention singly or in combination as described hereinafter with reference to the accompanying drawings. In the detailed drawings, like reference numerals indicate like components.

DETAILED ASPECTS OF THE INVENTION

For those solar concentrators that can afford to lose a small percentage of transparency on the side facing the sun, there is no need for the transparency of ITO. The grid could be drawn on paper, and Xerographically (or photographically) de-magnified (reduced) repeatedly until the resolution limit is reached. In the final step a thin plastic sheet would be used upon which the final Xerographic carbon grid would be laid down. The final reduced copy has a thin carbon grid laid down on a flexible transparent sheet for the top of the equipment. The carbon for the final step can be either the usual carbon particle mix used in standard Xerography, or preferably a mix containing carbon nanotubes. A similar grid sheet that is put on the bottom of the equipment, need not be transparent. However, if a transparent grid sheet is also used on the bottom of the equipment, the potential is retained for turning the equipment over and utilizing the bottom as the new top side, if needed. One limitation of the Xerographic reduction process is that the grid lines cannot be smaller in width than the wavelength of visible light. That means they are at least 2000 Angstroms in width which may be more than adequate for many purposes.

Many of the limitations of the Xerographic process can be overcome by implementing the grid by means of nanotubes. The section "DETAILED DESCRIPTION OF THE PRESENTLY PREFERRED EMBODIMENTS" gives a detailed description of the composition and functionality of the various nanotubes that supplements the information given in this section.

Carbon nanotubes (CNTs) are allotropes of carbon. A single wall carbon nanotube is a one-atom thick sheet of graphite (called graphene) rolled up into a seamless cylinder with diameter of the order of a nanometer. This results in a nanostructure where the length-to-diameter ratio exceeds 10,000. Such cylindrical carbon molecules have novel properties that make them potentially useful in many applications in nanotechnology, electronics, optics and other fields of materials science. They exhibit extraordinary strength and unique electrical properties, and are efficient conductors of heat. Inorganic nanotubes have also been synthesized.

Nanotubes are members of the fullerene structural family, which also includes buckyballs. Whereas buckyballs are spherical in shape, a nanotube is cylindrical, with at least one end typically capped with a hemisphere of the buckyball structure. Their name is derived from their size, since the diameter of a nanotube is on the order of a few nanometers wide (approximately 50,000 times smaller than the width of a human hair), while they can be up to several millimeters in length. There are two main types of nanotubes: single-walled nanotubes and multi-walled nanotubes; and nanotubes may contain metallic conductors to tailor their properties such as electrical resistance.

The nature of the bonding of a nanotube is described by applied quantum chemistry, specifically, orbital hybridization. The chemical bonding of nanotubes are composed entirely of bonds, similar to those of graphite. This bonding structure, which is stronger than the bonds found in diamond, provides the molecules with their unique strength. Nanotubes naturally align themselves into a "rope-like" structure with fibers held together by Van der Waals forces. Under high pressure, nanotubes can merge together, producing extremely strong, long-length rope-like tubes or wires through high-pressure nanotube linking.

The addition of low concentrations of carbon nanotubes to plastic makes it electrically conductive. This allows electrostatic painting to be used for the grid overlay. Thus the nanotube grid could be incorporated as a Sealant. Carbon Nanotubes can also be used in conductive Inks for spray-on circuits and coatings. A significant amount of research is being directed into the use of carbon nanotubes in conductive inks. The ability to spray-on conductive ink opens up some intriguing possibilities for 'spray-on' circuits and coatings. The control grid as described in the various embodiments of the instant invention, may be applied electrostatically by analogy to the description in U.S. Pat. Nos. 5,697,827; 5,764,004; 5,967,873 by Mario Rabinowitz; or by conventional methods such as spraying, dip coating, brushing, roll coating and other art-recognized techniques.

Although the cost per unit weight may appear high, the cost per manufactured grid can be significantly lower than ITO, not only because of the lower atomic weight and lower density of carbon, but because of the greater strength and manufacturability ease of carbon nanotubes.

DETAILED DESCRIPTION OF THE PRESENTLY PREFERRED EMBODIMENTS

Figure 1:
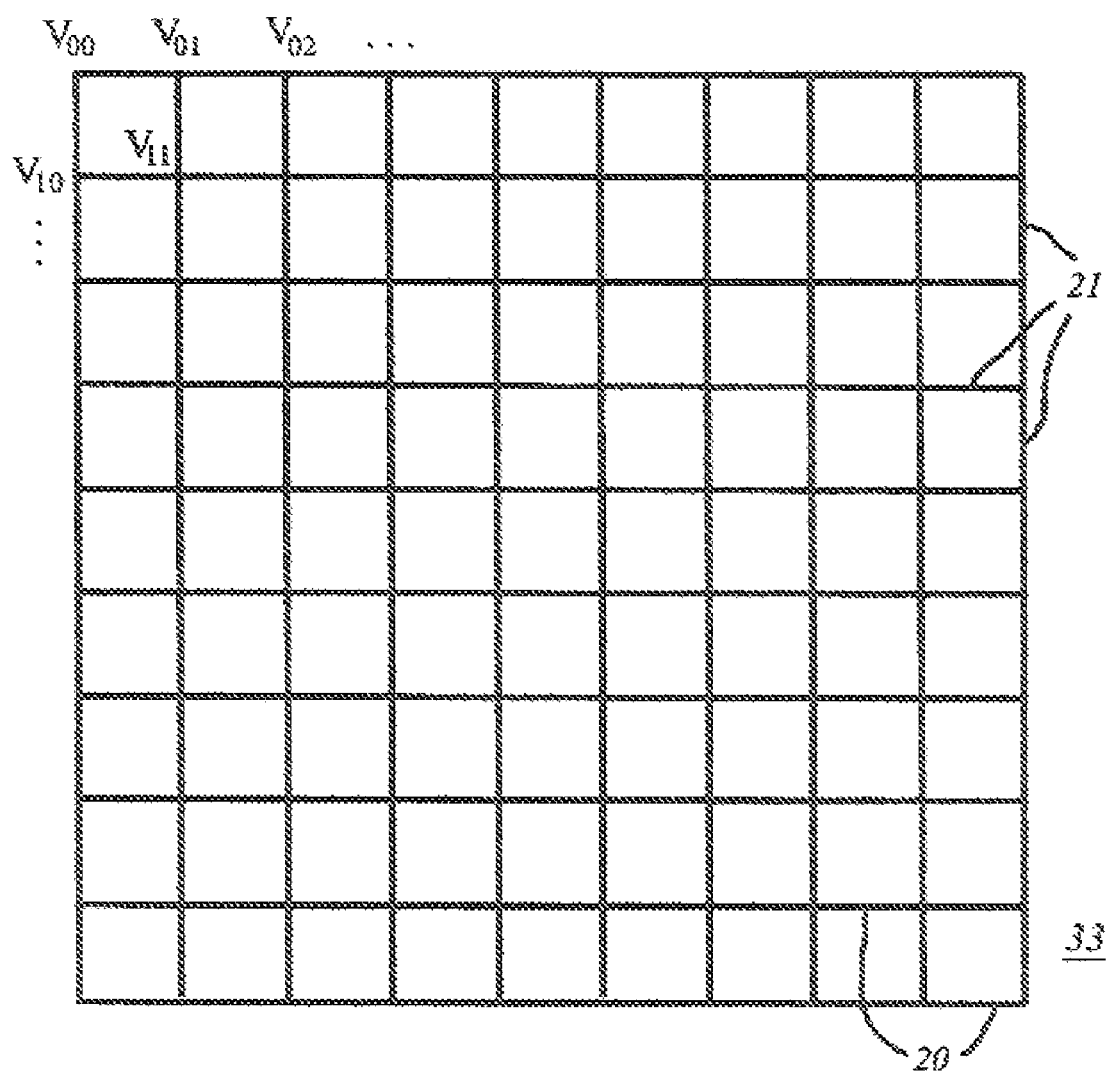
FIG. 1 is a schematic top view showing an electronic control grid for rotating the reflecting elements of a solar concentrator or other similar optical equipment. This schematic can represent either passive or active addressing as will be explained in the detailed description.

Solar concentrators may be classified either as passive non-tracking, predictive-tracking, or active-tracking. A predictive device uses a microprocessor to store and/or compute azimuth and attitude (elevation) coordinates for the sun's position. An active device utilizes sensors which in real time detect changes in the incident solar radiation either due to changes in the sun's position or atmospheric occlusion such as clouds. The sensors communicate via a microprocessor to activate the grid to point the active optical elements (e.g. mirrored balls) of the solar concentrator to that region of the sky that provides the most radiation. The microprocessor selectively addresses individual grid wires for establishing independent voltage differences to align (control) the active optical elements. For a detailed description of some methods for operating and coupling to control grids, refer to U.S. Pat. No. 6,964,486 by Mario Rabinowitz, "Alignment of Solar Concentrator Micro-Mirrors" issued on Nov. 15, 2005; and U.S. Pat. No. 7,187,490 by Mario Rabinowitz, "Induced Dipole Alignment Of Solar Concentrator Balls" by Mario Rabinowitz.

There are many tradeoffs in the design, manufacture, and utilization of a control grid for solar concentrators and related optical equipment. The traditional approach is to make the grid out of a thin and narrow transparent coating of ITO (Indium Tin Oxide). Among its drawbacks are high cost and fragility. A much simpler and cheaper technique would be a photographic or Xerographic reduction (demagnification) technique as taught in this instant invention. The grid could be drawn on paper, and Xerographically de-magnified (reduced) repeatedly until the resolution limit is reached. In the final step a thin plastic sheet would be used upon which the final Xerographic carbon grid would be laid down. The carbon can be either the usual carbon particle mix used in standard Xerography, or preferably a mix containing carbon nanotubes. The thin plastic grid sheet is then put next to the substrate holding the active optical elements. This method has novelty, simplicity, and low-cost in its favor.

As taught in this instant invention there are manifold technological advantages of a nanotube grid. The technique of using nanotubes has less blocking of light (higher degree of transparency), provides a more resilient grid, and greater control for tailoring the resistivity of the grid wires and bus bars. For most applications, utilization of carbon nanotubes as taught in this instant invention is the preferred embodiment.

Nanotubes can be tailored to have high resistivity so they can produce voltage drops (potential differences) with only a small flow of electrical current, and low power loss. Nanotubes can also be tailored to be used as low resistivity bus bars for distribution purposes. The bus bars allow uniform distribution of voltage across the high resistivity optically transparent grid. As is commonly practiced in the field, bus bars can be connected to one another and to the power supply by any appropriate technique such as wired connections along one or more edges or underside of the concentrator (or other optical equipment); or by printing bus bar headers on a glass or plastic backing. Traditionally bus bars are for example, evaporated gold or aluminum electrodes, or screen-printed silverfilled epoxy. However if the grid is formed of nanotubes it may be desirable and cost-effective to also make the bus bars out of nanotubes. The bus bar nanotubes need to be lower resistance which may be achieved by a combination of lower resistivity and/or larger cross-sectional area. By using nanotubes, the grid wires (electrodes) and the bus bars can be made substantially transparent, thereby increasing the visibility of the underlying optical equipment such as a solar concentrator.

FIG. 1 is a schematic top view showing an electronic control grid 33 for matrix addressing and alignment of the optical elements of a solar concentrator or other similar optical equipment, preferably comprised of nanotubes. The term "optical equipment" shall be used in the instant invention to stand for Solar Energy Concentrators which may be of the Fresnel reflector type, or other types and equipment requiring addressing and alignment, such as optical switches and display equipment. This grid 33 can be laid on the bottom of the equipment, on the top and bottom of the equipment, on the top of the equipment with a ground plane on the bottom of the equipment, etc. In order to avoid having several similar looking figures, this schematic may be thought of as a representation of any one of several addressing grid arrays. It may be a wire grid array with the vertical wires on top of the equipment, separated and insulated from the horizontal wires on the bottom of the equipment. It may be an actual interconnected grid with Thin Film Transistors (TFTs), tunneling junction transistors (as used in flash memories), or similar devices at each of the grid junctions shown in FIG. 1. In this case it is preferable to use Polymer based transistors for flexibility. The grid 33 may be a segmented array with each square being a separate insulated slab which may be composed of nanotubes uniformly filling not more of each slab area than permitted by the required transparency. In this case, the horizontal and vertical lines shown in FIG. 1 represent insulation between adjacent segments or slabs. Where conditions allow, the bus bars, grid or slabs may be Xerographically produced as described in the instant invention with sufficient transparency. The common element of all of these embodiments is the ability to impress the voltage $V_{ij}$ at the ij th node either statically or by means of a travelling wave. To minimize power dissipation, it is desirable to make resistive components 21 highly resistive so that a given voltage drop is accomplished with a minimum of current flow and hence with a minimum of power dissipation. The components 20 at or near the edges may have a higher conductivity (lower resistance) to function as bus bars, as needed, if separate bus bars are not incorporated.

There are many types of nanotubes. The different types of carbon nanotubes are preferred in the instant invention. The commonality of nanotubes is that they are wire rope-like structures with diameters starting in the nanometer range ~10 Angstroms. Many embodiments have a rope-like structure and are still much narrower than visible light that is within about 2000 to approximately 7500 Angstroms wavelength. Thus a nanotube grid can be effectively optically transparent with the light going around the grid wires. A nanotube grid could be incorporated in a Sealant or Coating for the equipment, or be in a separate sheet that is bonded to the equipment.

The implementation of a grid overlay can be achieved electrostatically by analogy to the description in U.S. Pat. Nos. 5,697,827; 5,764,004; 5,967,873 by Mario Rabinowitz; or by conventional coating or sealing processes. These include dipping, spraying, spin coating and flow coating to form the coating or sealant layer on the surface of the equipment. The sealant layer is then dry-heated to cure it. The required heating time and temperature vary according to the characteristics of the base material to be coated. Preferably, the thickness of the cured coating is between about 1 to 30 microns. A sealant of less than 100 microns thickness enveloping the grid structure and underlying equipment is adequate for most purposes.

MATERIAL ISSUES, ADVANTAGES, AND ALTERNATIVE EMBODIMENTS

As discussed earlier, a simple alternative embodiment would be to use a grid produced by a Xerographic reducing process. The grid could be drawn on paper, and Xerographically de-magnified (reduced) repeatedly until the resolution limit is reached. In the final step a thin plastic sheet would be used upon which the final Xerographic carbon grid would be laid down. The thin plastic grid sheet is then bonded to the substrate holding the active optical elements. Though this does not have the manifold technological advantages of a direct nanotube grid, it has novelty, simplicity, and low-cost in its favor.

Carbon Nanotubes

Carbon nanotubes are one of the strongest and stiffest materials known, in terms of tensile strength and elastic modulus respectively. This strength results from the covalent bonds formed between the individual carbon atoms. Multi-walled carbon nanotubes have been tested to have the tremendous tensile strength of 63 GPa ($63 \times 10^9$ Newtons/m$^2$=$63 \times 10^4$ atmospheres of tensile pressure). In comparison, high-carbon steel which at approximately 1.2 GPa is considered to have a very high tensile strength, but it is only about 2% of that these nanotubes. Carbon nanotubes have a very high elastic moduli, on the order of 1 TPa ($10^{12}$ Newtons/m$^2$). Because of the low density of carbon nanotubes, their specific strength of up to 48,462 kN·m/kg is the best of known materials, compared to high-carbon steel with 154 kN·m/kg. Single-wall carbon nanotubes are the toughest fibres known, and structural materials that incorporate carbon nanotubes generally have superior properties.

In addition to carbon nanotubes, there are also Inorganic Nanotubes, of which the following is a representative sample: Boron nitride, Silicon, Titanium dioxide Tungsten disulphide, Molybdenum disulphide. These are described in the DEFINITIONS section of the instant invention.

Metal atoms may be incorporated in the nanotubes to tailor their conductivity. Furthermore nanotubes with magnetic cores can be positioned by magnetic fields to form a fine grid. These magnetic nanotubes can be filtered, aligned, and precisely directed in fabricating a grid. Another fabrication process would be to grow nanotubes on a template that controls the alignment of the nanotubes and the width of the grid lines. University of Texas at Dallas nanotechnologists et al have produced transparent carbon nanotube sheets that are stronger than the same-weight steel sheets. This can be a way of making a segmented array grid comprised of small slabs as described above.

For those devices that utilize nanotubes in one embodiment or another of the instant invention, it is judicious to join or otherwise connect the nanotubes to give reliable and repeatable resistivity to prevent undue readjustments of control voltages. This is an important factor that affects by does not limit their long term success. In the course of utilization of a nanotubes, one may also improve related properties of the equipment without the incurrence of substantial cost. So a general strategy would be to ameliorate all equipment properties (e.g. mechanical) by incorporating with such improvements that nanotubes easily bring with them. In the course of implementation of this strategy, it became apparent that the application of nanotubes achieves many secondary beneficial effects in addition to an improved grid. Of the many different kinds of nanotubes that may be used as instructed by the instant invention, carbon nanotubes are the preferred embodiment. As is described here in detail, the objectives of the instant invention may be accomplished by any of a number of ways separately or in combination, as taught herein.

While the instant invention has been described with reference to presently preferred and other embodiments, the descriptions are illustrative of the invention and are not to be construed as limiting the invention. Thus, various modifications and applications may occur to those skilled in the art without departing from the true spirit and scope of the invention as summarized by the appended claims together with their full range of equivalents. It is to be understood that in said claims, ingredients or compounds recited in the singular are intended to include compatible mixtures of such ingredients wherever the sense permits. It is also to be understood that the following claims are intended to cover all of the generic and specific features of the invention herein described, and all statements of the scope of the invention which, as a matter of language, might be said to fall there between.

The invention claimed is:

1. A solar concentrator equipment comprising:
 a) at least one layer of active electronic control grid on the outer surface of said solar concentrator equipment;
 b) said control grid activated by a microprocessor;
 c) said control grid forming a matrix of orthogonal lines;
 d) said orthogonal lines having voltage nodes at the intersection junctions;
 e) wherein said active electronic control grid being optically transparent in the wavelength range of about 2000 to approximately 7500 Angstroms; and
 f) said active electronic control grid of said solar concentrator equipment having a grid structure composed of nanotubes.

2. The equipment of claim 1 wherein said active electronic control grid is
 composed of nanotubes resulting from the output of a Xerographic reduction process.

3. The equipment of claim 1 wherein said control grid contains contiguous nanotubes.

4. The equipment of claim 1 wherein said nanotubes are carbon nanotubes.

5. The equipment of claim 1 wherein said active electronic control grid further contains contiguous carbon particles.

6. The equipment of claim 1 wherein said nanotubes are silicon nanotubes.

7. The equipment of claim 1 wherein said active electronic control grid contains nanotubes of at least one of the following compositions: boron nitride, titanium dioxide, tungsten disulphide, and molybdenum disulphide.

8. A method for manufacturing optical equipment comprising the steps of:
 a) forming an active electronic control grid comprised of nanotubes;
 b) said control grid comprised of nanotubes being optically transparent on at least one side of said optical equipment;
 c) wherein said active electronic control grid being optically transparent in the wavelength range of about 2000 to approximately 7500 Angstroms;
 e) said control grid activated by a microprocessor; and
 f) said control grid forming a matrix of orthogonal lines.

9. The method of claim 8 wherein said forming an active control grid is made according to the steps of
 a) placing nanotubes in the particulate compartment of a Xerographic machine;

b) placing transparent sheets in the output compartment of a Xerographic machine;

c) reducing an image of said active electronic control grid by means of a Xerographic reduction process; and d) forming an active electronic control grid comprised of nanotubes as the output of said Xerographic machine.

10. The method of claim 8 wherein said control grid comprised of nanotubes provides electronic control for an optical switch.

11. The method of claim 8 wherein said control grid comprised of nanotubes provides electronic control for display equipment.

12. The method of claim 8 wherein said control grid comprised of nanotubes provides electronic control for illumination equipment.

13. A solar optical equipment comprising:

a) at least one layer of active electronic control grid on said solar equipment b) said electronic control grid addressed by a microprocessor;

c) said active electronic control grid being optically transparent on at least one side of said solar optical equipment;

d) wherein said active electronic control grid being optically transparent in the wavelength range of about 2000 to approximately 7500 Angstroms; and e) said active electronic control grid containing contiguous carbon particles; and f) said control grid forming a matrix of orthogonal lines.

14. The equipment of claim 13 wherein said active electronic control grid is produced by a Xerographic reduction process.

15. The equipment of claim 13 wherein said active electronic control grid contains nanotubes.

16. The equipment of claim 13 wherein said active electronic control grid contains carbon nanotubes.

17. The equipment of claim 13 wherein said control grid contains carbon fibers.

18. The equipment of claim 13 wherein said control grid contains silicon nanotubes.

19. The equipment of claim 13 wherein said control grid contains nanotubes of at least one of the following compositions: boron nitride, titanium dioxide tungsten disulphide, and molybdenum disulphide.

20. The equipment of claim 13 wherein said active electronic control grid is connected to bus bars made of nanotubes.

* * * * *